United States Patent [19]

Gaku et al.

[11] Patent Number: 5,082,402

[45] Date of Patent: Jan. 21, 1992

[54] METHOD OF DRILLING OF THROUGH-HOLES IN PRINTED CIRCUIT BOARD PANELS

[75] Inventors: Morio Gaku; Hidenori Kimbara, both of Tokyo, Japan

[73] Assignee: Mitsubishi Gas Chemical Co. Ltd., Tokyo, Japan

[21] Appl. No.: 737,234

[22] Filed: Jul. 29, 1991

[30] Foreign Application Priority Data

Aug. 8, 1990 [JP] Japan ............... 1-208239

[51] Int. Cl.$^5$ ............................ B23B 35/00
[52] U.S. Cl. ................. 408/1 R; 252/52 A; 252/56 R
[58] Field of Search ............ 252/52 A, 56 R; 408/1 R, 56, 61

[56] References Cited

U.S. PATENT DOCUMENTS

| 4,519,732 | 5/1985 | Sutcliffe | 408/61 |
| 4,781,495 | 11/1988 | Hatch et al. | 408/1 R |
| 4,929,370 | 5/1990 | Hatch et al. | 408/1 R |

FOREIGN PATENT DOCUMENTS 80495  5/1982  Japan ................ 252/52 A

*Primary Examiner*—Daniel W. Howell
*Attorney, Agent, or Firm*—Wenderoth, Lind & Ponack

[57] ABSTRACT

A method of drilling a through-hole in a printed circuit board panel, which comprises placing a water-soluble lubricant sheet on one surface or each of two surfaces of a printed circuit board panel and drilling a through-hole through the printed circuit board panel, the water-soluble lubricant sheet being composed of a mixture of 20 to 90% by weight of a polyethylene glycol having a weight average molecular weight of not less than 10,000 with 10 to 80% by weight of a water-soluble lubricant and having a thickness of 0.05 to 3 mm.

5 Claims, No Drawings

METHOD OF DRILLING OF THROUGH-HOLES IN PRINTED CIRCUIT BOARD PANELS

FIELD OF THE INVENTION

The present invention relates to a method of drilling a through-hole in a double-side or multi-layer printed circuit board panel. More specifically, it relates to a method of drilling a through-hole through a printed circuit board panel with a water-soluble lubricant sheet on one surface or each of the surfaces of the panel, which method permits inhibition of heat generation of a drill bit and the making of high-quality through-holes with good productivity.

PRIOR ART

U.S. Pat. No. 4,781,495 and U.S. Pat. No. 4,929,370 disclose methods of drilling through-holes through a laminate formed by applying a metal foil on one surface or each of two surfaces of an insulating material, in which a through-hole is drilled through the laminate while a water-soluble lubricant is placed on one surface or each of the surfaces of the laminate. These U.S. patents disclose the use of a sheet prepared by impregnating a porous sheet of paper, etc., with a mixture containing a solid water-soluble lubricant of a glycol such as diethylene glycol, dipropylene glycol, etc., a fatty acid ester and a non-ionic surfactant.

However, these methods disclosed in the above U.S. patents have the following problems: the prevention of drilling-induced heat generation is sometimes not satisfactory, there are cases where the impregnation of the above mixture in a porous sheet is poor, and the sheet itself sometimes shows sticking nature. Sticky sheets are difficult to handle and decreases workability, and a peeling sheet, if used, increases a cost.

SUMMARY OF THE INVENTION

It is an object of the present invention to provide a method of drilling a through-hole in a printed circuit board panel, which produces an excellent effect on the prevention of heat generation of a drill bit when the hole is made, and which can give good-quality through-holes with good productivity.

It is another object of the present invention to provide a method of drilling a through-hole in a printed circuit board panel, which can give good-quality through-holes with good productivity by means of a water-soluble lubricant sheet having excellent effect on prevention of heat generation and being free from sticking nature.

It is further another object of the present invention to provide a method of drilling a through-hole in a printed circuit board panel, which can give through-holes almost free from causing a pink ring and a smear.

According to the present invention, there is provided a method of drilling a through-hole in a printed circuit board panel, which comprises placing a water-soluble lubricant sheet on one surface or each of two surfaces of a printed circuit board panel and drilling a through-hole through the printed circuit board panel, the water-soluble lubricant sheet being composed of a mixture of 20 to 90% by weight of a polyethylene glycol having a weight average molecular weight of not less than 10,000 with 10 to 80% by weight of a water-soluble lubricant and having a thickness of 0.05 to 3 mm.

DETAILED DESCRIPTION OF THE INVENTION

The printed circuit board panel to which the present invention is addressed refers to a variety of circuit-printing materials which are formed by integrating a metal foil and an electrically insulating material and used as a material for a variety of printed circuit boards. Specific examples of the printed circuit board panel are a metal foil-clad laminated board, a multi-layer laminated board having inner layer(s) of a printed wiring network, a metal foil-clad, multi-layer laminated board having inner layer(s) of a printed wiring network, a metal foil-clad plastic film, and the like.

The polyethylene glycol having a weight average molecular weight of not less than 10,000, used in the present invention, is generally obtained by polymerization of ethylene oxide, and has the formula of $HO(C_2H_4O)_nH$. A polyethylene glycol having a weight average molecular weight of less than 10,000 is in the form of a wax and fragile, and it is too easily crushed to form a sheet.

In the present invention, the water-soluble lubricant is specifically selected from polyethylene glycol having a weight average molecular weight of 500 to 9,000; polyoxyethylene monoethers having a weight average molecular weight of 500 to 9,000 such as polyoxyethylene olely ether, polyoxyethylene cetyl ether, polyoxyethylene stearyl ether, polyoxyethylene lauryl ether, polyoxyethylene dodecyl ether, polyoxyethylene nonylphenyl ether, polyoxyethylene octylphenyl ether, etc.; polyoxethylene esters having a weight average molecular weight of 500 to 9,000 such as polyoxyethylene monolaurate, polyoxyethylene monostearate, polyoxyethylene monooleate, polyoxyethylene beef tallow fatty acid ester, etc.; polyoxyethylene sorbitan monoesters having a weight average molecular weight of 500 to 9,000 such as polyoxyethylene sorbitan monostearate, etc.; polyglycerin monostearates having a weight average molecular weight of 500 to 9,000 such as hexaglycerin monostearate, decaglycerin monostearate, etc.; polyoxyethylene-propylene-block polymers having a weight average molecular weight of 500 to 9,000; and the like. Preferred are those lubricants having a melting point or softening point in the range between 30° C. and 200° C., particularly between 40° C. and 150° C.

The water-soluble lubricant sheet is produced from a mixture containing 20 to 90% by weight of the above polyethylene glycol having a weight average molecular weight of not less than 10,000 and 80 to 10% by weight of the above water-soluble lubricant. When the amount of the water-soluble lubricant is larger than the above upper limit, it is difficult to form a sheet. When it is smaller than the above lower limit, the resultant sheet undesirably shows insufficient lubricity.

The water-soluble lubricant sheet usually has a thickness of 0.05 to 3 mm, preferably 0.1 to 2 mm. When this thickness is smaller than the above range, the effect on prevention of heat generation of a drill bit is insufficient. When it is larger than the above range, it is required to increase the length of a drill bit. As a result of an increase in the length, the drill bit is undesirably likely to cause an unnecessary movement, which results in a poor quality of a through-hole, and the drill bit is increasingly likely to be broken.

The method for producing the water-soluble lubricant sheet is not specially limited. In general, the above polyethylene glycol and the above water-soluble lubricant are mixed to form a homogeneous mixture by means of a kneading apparatus such as a roll, a kneader, etc., optionally under heat, and the homogeneous mixture is extruded, press-formed or rolled to form a sheet having a thickness of 0.05 to 3 mm. The so-obtained water-soluble lubricant sheets are usually used for drilling in such a manner that one sheet of them is placed on one plastic or metal foil surface and optionally one sheet of them is placed on the other surface. When one water-soluble lubricant sheet is used, it is preferred to place it toward the drill bit side. It is more preferred to place one water-soluble lubricant sheet on one surface and another on another surface.

According to the present invention, there is provided a method of drilling a through-hole in a printed circuit board panel, which method is almost free from occurrence of a smear and a pink ring. Further, in the method of the present invention, the water-soluble lubricant sheet used in the present invention is easy to handle due to freedom from sticking nature and through-holes having excellent quality can be obtained. Furthermore, in the method of the present invention, a stress exerted on a metal foil portion is small and the degree of occurrence of a pink ring can be therefore decreased.

The present invention will be detailed below by reference to Examples, in which "part" stands for "part by weight" unless otherwise specified.

EXAMPLE 1

A polyethylene glycol having a weight average molecular weight of more than 10,000 and a water-soluble lubricant, of which the amounts are shown in Table 1, were kneaded at a temperature between 80° C. and 120° C., and the resultant mixture was extruded with an extruder to form sheets having a thickness of 1 mm ("present sheet" hereinafter).

A 1.6 mm thick epoxy-glass six-layered board (formed of 4 inner layers, an inner copper layer having a thickness of 70 μm and an outer copper layer having a thickness of 18 μm) was drilled under the following conditions.
Drilling conditions
Drill bit: 0.35 mmφ
Revolution rate: 80,000 rpm
Feed rate: 1.6 m/min.
Number of boards to be drilled: 2
How to Arrange (from drill bit side): 100 μm thick aluminum foil/present sheet/six-layered board/present sheet/six-layered board/paper phenol laminate Table 1 shows the presence or absence of sticking nature of the sheet and the degree of occurrence of a smear, and Table 2 shows the degree of occurrence of a pink ring.

The smear and pink ring were evaluated as follows.
Smear: A wall of a through-hole was measured for an area in which the inner copper layer was exposed, i.e. a degree of adherence of a resin, by observing it with a microscope. The degree of occurrence of a smear was rated as follows: 100% exposure of copper=10, 50% exposure of copper=5, no exposure of copper=0. Specifically, 4,000 through-holes were drilled with a drill bit, and then 20 through-holes were drilled. The walls of these 20 through-holes were measured to obtain an average. In the column of "degree of smear occurrence after 4,000 hits" in Table 1, the parenthesized data shows the smallest copper exposure area among the 20 through-holes.

Pink ring: After drilled, the two six-layered boards were immersed in a 4N HCl aqueous solution at 25° C. for 5 minutes, and a length of corrosion with 4N HCl from the through-hole wall was measured on each of the boards. Table 2 shows the largest length when the measurement was carried out with 10 through-holes.

A smear and a pink ring prevent a contact between a plated through-hole and an electrically conductive layer formed on an insulating material, and the degree of occurrence of these constitutes an important standard for evaluation of quality of printed circuit board panels.

EXAMPLES 2-7

Example 1 was repeated except that the amount of the polyethylene glycol having a weight average molecular weight of more than 10,000 and the amount and type of the water-soluble lubricant were changed as shown in Table 1. The results are shown in Tables 1 and 2.

COMPARATIVE EXAMPLE 1

The drilling in Example 1 was repeated except that the present sheet was not used and that the arrangement of six-layered boards, etc., was changed to 100 μm thick aluminum foil/six-layered board/six-layered board/paper phenol laminate. Tables 1 and 2 show the results.

COMPARATIVE EXAMPLE 2

670 ml of Trihydroxystearin of polyethylene glycol having a weight average molecular weight of 200 was heated to 54° C., and 250 ml of dipropylene glycol was mixed therewith. The resultant mixture was heated to 62° C., and 80 ml of a fatty acid ester (trade name: Paricin 13, supplied by Cas Gen) was mixed therewith.

The resultant mixture was roll-coated on a 0.15 mm thick paper sheet at 60° C. such that the amount of the resultant coating was 60% by weight, and the resultant sheet was cooled to room temperature to give water-soluble lubricant sheets.

The drilling in Example 1 was repeated except that these water-soluble lubricant sheets were used in place of the present sheets. Tables 1 and 2 show the results.

TABLE 1

| | Polyethylene glycol | | Water-soluble lubricant | | Sticking nature | Degree of occurrence of smear after 4,000 hits |
|---|---|---|---|---|---|---|
| | Molecular weight | part | kind* | part | | |
| Ex. 1 | 4,000,000 | 40 | LEG1 | 60 | No | 9.5 (9.8) |
| Ex. 2 | 2,800,000 | 50 | LEG2 | 50 | No | 9.4 (8.8) |
| Ex. 3 | 1,800,000 | 50 | LEG3 | 50 | No | 9.3 (8.7) |
| Ex. 4 | 1,100,000 | 50 | LEG4 | 50 | No | 9.3 (8.6) |
| Ex. 5 | 700,000 | 50 | LEG5 | 50 | No | 9.3 (8.5) |
| Ex. 6 | 400,000 | 50 | LEG6 | 50 | No | 9.5 (9.0) |
| Ex. 7 | 100,000 | 70 | LEG7 | 30 | No | 9.4 (8.8) |
| CEx. 1 | — | — | — | — | — | 8.5 (4.0) |
| CEx. 2 | — | — | — | — | Yes | 9.0 (7.5) |

Note:
Water-soluble lubricant (weight average molecular weight)
LEG1 = polyethylene glycol (1,000)
LEG2 = polyoxyethylene lauryl ether (1,100)
LEG3 = polyoxyethylene monostearate (3,300)
LEG4 = polyoxyethylene sorbitan monostearate (1,300)
LEG5 = hexaglycerin monostearate (530)
LEG6 = polyoxyethylene-propylene block polymer (8,800)
LEG7 = polyethylene glycol (4,000)

TABLE 2

| | Pink ring after 4,000 hits | |
|---|---|---|
| | Six-layered board on aluminum foil side | Six-layered board on paper laminate side |
| Ex. 1 | 200 μm | 100 μm |
| Ex. 2 | 200 μm | 100 μm |
| Ex. 3 | 200 μm | 125 μm |
| Ex. 4 | 200 μm | 125 μm |
| Ex. 5 | 225 μm | 125 μm |
| Ex. 6 | 200 μm | 100 μm |
| Ex. 7 | 200 μm | 100 μm |
| CEx. 1 | 500 μm | 400 μm |
| CEx. 2 | 300 μm | 150 μm |

EXAMPLES 8-10

Example 3 was repeated except that the thickness of the present sheet was changed to 0.1 mm (Example 8), 0.2 mm (Example 9) or 0.5 mm (Example 10).

Table 3 shows the results.

TABLE 3

| | Polyethylene glycol | | Water-soluble lubricant | | Thickness of present sheet | Degree of occurrence of smear after 4,000 hits |
|---|---|---|---|---|---|---|
| | Molecular weight | part | kind | part | | |
| Ex. 8 | 1,800,000 | 50 | LEG3 | 50 | 0.1 mm | 9.1 (8.0) |
| Ex. 9 | 1,800,000 | 50 | LEG3 | 50 | 0.2 mm | 9.3 (8.5) |
| Ex. 10 | 1,800,000 | 50 | LEG3 | 50 | 0.5 mm | 9.3 (8.6) |

LEG3 = polyoxyethylene monostearate (3,300)

EXAMPLE 11

Example 3 was repeated except for the following changes in the drilling conditions and the arrangement of boards and sheets.

Number of boards to be drilled: 3

How to arrange (from drill bit side): 100 μm thick aluminum foil/present sheet/six-layered board/six-layered board/six-layered board/paper phenol laminate Table 4 shows the results.

COMPARATIVE EXAMPLE 3

Example 11 was repeated without using the present sheet. Table 4 shows the results.

COMPARATIVE EXAMPLE 4

Example 11 was repeated except that the same water-soluble lubricant sheet as that prepared in Comparative Example 2 was used in place of the present sheet used in Example 11.

Table 4 shows the results.

TABLE 4

| | Pink ring after 4,000 hits Six-layered board on aluminum foil side | Degree of occurrence of smear after 4,000 hits |
|---|---|---|
| Ex. 11 | 200 μm | 9.5 (7.0) |
| CEx. 3 | 500 μm | 4.0 (0.5) |
| CEx. 4 | 400 μm | 7.0 (2.5) |

What is claimed is:

1. A method of drilling a through-hole in a printed circuit board panel, which comprises placing a water-soluble lubricant sheet on one surface or each of two surfaces of a printed circuit board panel and drilling a through-hole through the printed circuit board panel, the water-soluble lubricant sheet being composed of a mixture of 20 to 90% by weight of a polyethylene glycol having a weight average molecular weight of not less than 10,000 with 10 to 80% by weight of a water-soluble lubricant and having a thickness of 0.05 to 3 mm.

2. A method according to claim 1, wherein the water-soluble lubricant is at least one member selected from a polyethylene glycol having a weight average molecular weight of 600 to 9,000, a polyoxyethylene monoether having a weight average molecular weight of 600 to 9,000, a polyoxyethylene sorbitan monoester having a weight average molecular weight of 600 to 9,000, a polyglycerin monostearate having a weight average molecular weight of 600 to 9,000 and a polyoxyethylenepropylene-block copolymer having a weight average molecular weight of 600 to 9,000.

3. A method according to claim 2, wherein the water-soluble lubricant has a melting point or softening point between 30° C. and 200° C.

4. A method according to claim 1, wherein the water-soluble lubricant sheet has a thickness of 0.1 to 2 mm.

5. A method according to claim 1, wherein the water-soluble lubricant is an ester of a polyoxyethylene.

* * * * *